US010826008B2

(12) United States Patent
Kurata et al.

(10) Patent No.: US 10,826,008 B2
(45) Date of Patent: Nov. 3, 2020

(54) DISPLAY DEVICE

(71) Applicant: Japan Display Inc., Tokyo (JP)

(72) Inventors: Kohei Kurata, Tokyo (JP); Satoshi Maruyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/594,143

(22) Filed: Oct. 7, 2019

(65) Prior Publication Data
US 2020/0035938 A1 Jan. 30, 2020

Related U.S. Application Data

(63) Continuation of application No. 15/608,479, filed on May 30, 2017, now Pat. No. 10,476,020.

(30) Foreign Application Priority Data

Jul. 15, 2016 (JP) .................................. 2016-140377

(51) Int. Cl.
*H01L 27/12* (2006.01)
*H01L 51/50* (2006.01)
(Continued)

(52) U.S. Cl.
CPC ...... *H01L 51/5012* (2013.01); *H01L 27/1222* (2013.01); *H01L 27/1225* (2013.01);
(Continued)

(58) Field of Classification Search
USPC ........................................................ 257/40
See application file for complete search history.

(56) References Cited

U.S. PATENT DOCUMENTS

2011/0049507 A1 3/2011 Choi
2011/0095274 A1 4/2011 Chung et al.
(Continued)

FOREIGN PATENT DOCUMENTS

CN 102738002 A 10/2012
JP 2015-056566 A 3/2015
(Continued)

OTHER PUBLICATIONS

Taiwanese Office Action dated Nov. 21, 2017 for corresponding Taiwanese Application No. 106116818 with partial translation.
(Continued)

*Primary Examiner* — Fazli Erdem
(74) *Attorney, Agent, or Firm* — Michael Best & Friedrich LLP

(57) ABSTRACT

A display device according to the present invention includes a substrate, and a plurality of pixels arranged in the substrate, wherein each of the plurality of pixels includes a light emitting element, a first transistor, a second transistor, a first insulation layer and a second insulation layer, the first transistor includes a first semiconductor layer, the second transistor includes a second semiconductor layer, the first insulation layer is arranged across the plurality of pixels between the first semiconductor layer and the second semiconductor layer, the second insulation layer is arranged between the first insulation layer and the second semiconductor layer, the first semiconductor layer is arranged on the substrate side sandwiching the first insulation layer with respect to the second semiconductor layer, the first insulation layer includes a silicon oxide layer; and the second insulation layer includes an aluminum oxide layer.

4 Claims, 12 Drawing Sheets

(51) Int. Cl.
  *H01L 27/32* (2006.01)
  *H01L 51/52* (2006.01)
(52) U.S. Cl.
  CPC .......... *H01L 27/1248* (2013.01); *H01L 27/32* (2013.01); *H01L 27/3258* (2013.01); *H01L 27/3262* (2013.01); *H01L 51/52* (2013.01)

(56) References Cited

U.S. PATENT DOCUMENTS

| | | |
|---|---|---|
| 2011/0284959 A1 | 11/2011 | Kimura et al. |
| 2012/0256177 A1* | 10/2012 | Yamazaki ............ H01L 29/7869 257/43 |
| 2012/0258575 A1* | 10/2012 | Sato .................... H01L 29/7869 438/151 |
| 2012/0261734 A1 | 10/2012 | Saito |
| 2013/0015437 A1 | 1/2013 | Yamazaki |
| 2015/0001483 A1 | 1/2015 | Namkung et al. |
| 2015/0060827 A1 | 3/2015 | Sasaki et al. |
| 2015/0108470 A1 | 4/2015 | Yamazaki et al. |
| 2015/0155312 A1* | 6/2015 | Yamazaki ......... H01L 29/66742 257/43 |
| 2015/0187952 A1 | 7/2015 | Yamazaki et al. |
| 2015/0303217 A1* | 10/2015 | Tanaka .............. H01L 23/53257 257/43 |
| 2015/0318402 A1 | 11/2015 | Yamazaki et al. |
| 2015/0349127 A1* | 12/2015 | Kurata ................ H01L 27/1225 257/43 |
| 2016/0240632 A1* | 8/2016 | Satoh ...................... H01L 29/41 |
| 2016/0276370 A1* | 9/2016 | Miyairi ............. H01L 21/76807 |
| 2016/0307936 A1 | 10/2016 | Shin et al. |
| 2016/0372497 A1 | 12/2016 | Lee et al. |
| 2017/0154941 A1 | 6/2017 | Oh et al. |
| 2017/0207245 A1* | 7/2017 | Hanada ............... H01L 27/1225 |
| 2017/0256569 A1 | 9/2017 | Ohara |

FOREIGN PATENT DOCUMENTS

| | | |
|---|---|---|
| KR | 10-2013-0082079 A | 7/2013 |
| KR | 10-2015-0101418 A | 9/2015 |
| KR | 2015-0101418 A | 9/2015 |
| TW | 201511254 A | 3/2015 |
| TW | 201517276 A | 5/2015 |
| WO | 2016/048385 A1 | 3/2016 |

OTHER PUBLICATIONS

Taiwanese Office Action dated Jun. 20, 2018 for the corresponding Taiwanese Patent Application No. 106116818, with partial translation.
Korean Office Action dated Sep. 17, 2018 for the corresponding Korean application No. 10-2017-0061059, with partial English translation.
Taiwanese Office Action dated Feb. 26, 2019 for the corresponding Taiwanese Patent Application No. 106116818, with partial English Translation.
Chinese Office Action dated Jan. 6, 2020 for the corresponding Chinese application No. 201710363064.1, with partial English machine translation retrieved from the EPO Global Dossier.
Japanese Office Action dated Feb. 18, 2020 for the corresponding Japanese application No. 2016-140377, with partial English machine translation retrieved from the EPO Global Dossier.
Chinese Office Action issued on May 28, 2020 for the corresponding Chinese application No. 201710363064.1; with Partial English Machine Translation retrieved from the EPO Global Dossier.
Chinese Final Office Action issued on Aug. 19, 2020 for the corresponding Chinese application No. 201710363064.1.

* cited by examiner

DISPLAY DEVICE

CROSS REFERENCE TO RELATED APPLICATIONS

This application is a continuation of U.S. application Ser. No. 15/608,479, filed on May 30, 2017. Further, this application is based upon and claims the benefit of priority from the prior Japanese Patent Application No. 2016-140377, filed on Jul. 15, 2016, the entire contents of which are incorporated herein by reference.

FIELD

The present invention is related to a display device. In particular, the present invention is related to a display device using a silicon semiconductor and an oxide semiconductor.

BACKGROUND

Since low temperature poly-silicon (LTPS) which is used in liquid crystal display devices has high carrier mobility, it has become a technology widely used in current medium and small scale display devices. The development of an array process using LTPS technology as a base is also proceeding in organic EL display devices.

However, it is difficult to form a LTPS layer with sufficiently few variations in an excimer laser anneal process. Variation in the properties of a thin film transistor (TFT) due to variation in LPTS causes variation in luminosity of an organic EL display device.

Therefore, using both transistors manufactured by poly-crystal silicon which has high drive capabilities and also transistors using transparent amorphous oxide semiconductors in which low characteristic variation is expected as a measure for reducing power consumption and dealing with characteristic variation is being researched.

For example, a thin film transistor is disclosed in Japanese Laid Open Patent Publication No. 2015-056566 arranged with a transparent amorphous oxide semiconductor layer formed above a substrate, a gate insulation film formed above the transparent amorphous oxide semiconductor layer, a gate electrode formed above the gate insulation film, and a source electrode and drain electrode each formed so as not to overlap the gate electrode above the transparent amorphous oxide semiconductor layer, wherein the gate insulation film is processed to the same width as the gate electrode, and a resistance value of a region which does not overlap the gate insulation film in the transparent amorphous oxide semiconductor layer is lower than a resistance value of a region which overlaps the gate insulation film by a reduction process of a reduction gas.

However, the following problems exist in a display device arranged with a transistor which uses an oxide semiconductor. For example, when hydrogen or water infiltrates to an oxide semiconductor layer from a layer adjacent to the oxide semiconductor layer, there is concern that characteristics of the transistor will degrade. Specifically, there is a drop in mobility leading to variation in a threshold value and the like which can cause a variation in luminosity of the display device. On the other hand, it is known that the variation in characteristics of a transistor due to hydrogenation of a semiconductor layer is relieved in a transistor which uses poly-crystal silicon and the characteristics of the transistor are improved. In order to be able to respectively utilize the characteristics of a transistor which uses an oxide semiconductor and a transistor which uses poly-crystal silicon, it is necessary to overcome the conflicting properties caused by the effects of hydrogen and the like when actualizing a display device mounted with both transistors.

SUMMARY

A display device related to one embodiment of the present invention includes a substrate, and a plurality of pixels arranged in the substrate, wherein each of the plurality of pixels includes a light emitting element, a first transistor, a second transistor, a first insulation layer and a second insulation layer, the first transistor includes a first semiconductor layer, the second transistor includes a second semiconductor layer, the first insulation layer is arranged across the plurality of pixels between the first semiconductor layer and the second semiconductor layer, the second insulation layer is arranged between the first insulation layer and the second semiconductor layer, the first semiconductor layer is arranged on the substrate side sandwiching the first insulation layer with respect to the second semiconductor layer, the first insulation layer includes a silicon oxide layer, and the second insulation layer includes an aluminum oxide layer.

DESCRIPTION OF EMBODIMENTS

Figure 1:
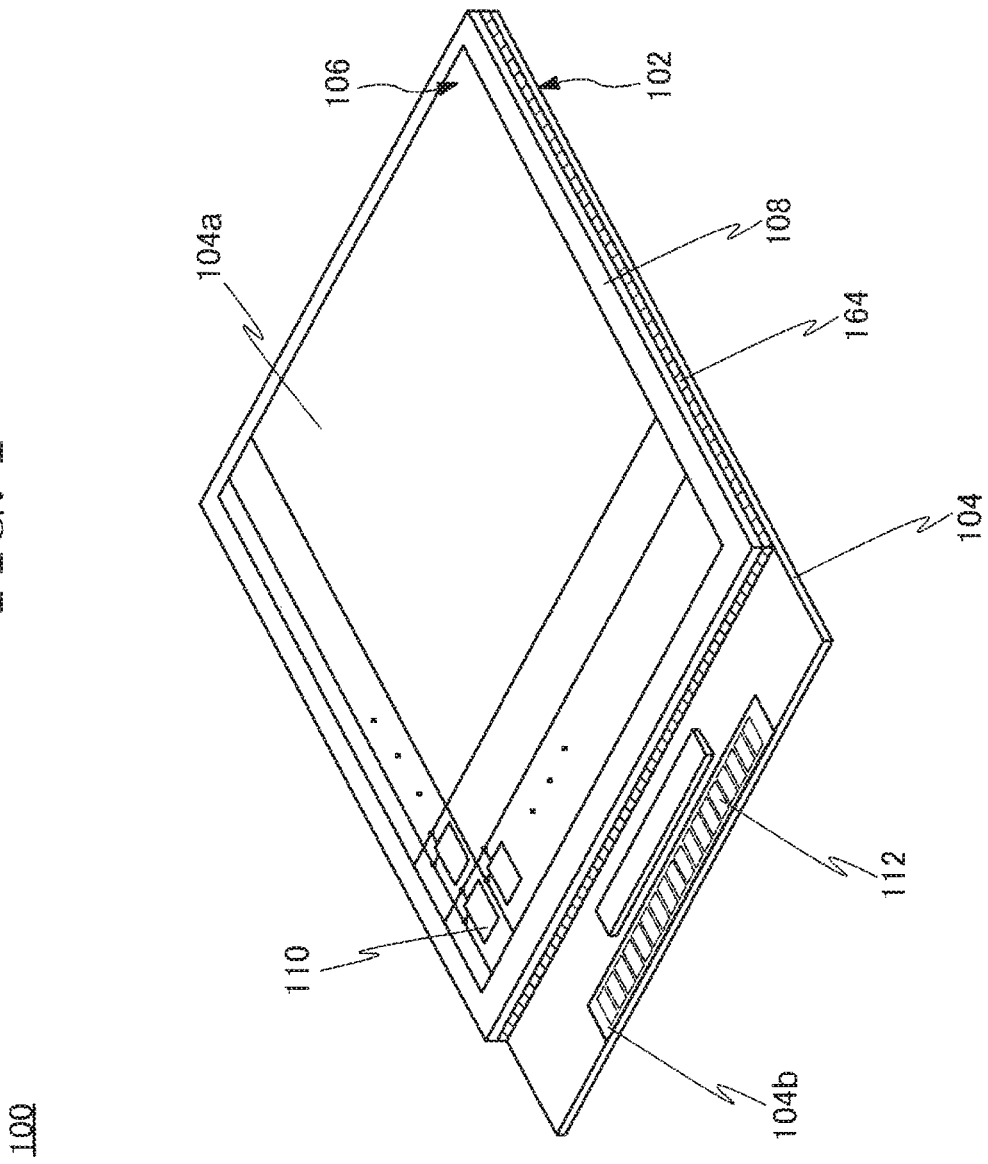
FIG. 1 is a perspective diagram for explaining an approximate structure of a display device related to one embodiment of the present invention.

A display device related to a number of embodiments of the present invention is explained in detail below while referring to the diagrams. However, the display device of the present invention should not be limited to the embodiments below and it is possible to perform the present invention using various modifications. In all of the embodiments, the same reference symbols are attached to similar elements. In addition, the dimension ratios in the drawings may be different from actual ratios and parts of the structure may be omitted from the drawings.

First Embodiment

[External Structure]

FIG. 1 is a perspective diagram for explaining an external structure of a display device 100 related to the present embodiment. An external structure of a display device 100 related to the present embodiment is explained using FIG. 1.

The display device 100 related to the present embodiment includes an array substrate 102, an opposing substrate 106 and a plurality of connection terminals 112.

The array substrate 102 includes at least a first substrate 104 and a plurality of pixels 110. The first substrate 104 includes a display region 104a and a terminal region 104b on a surface thereupon. The first substrate 104 plays the role of a support body for the plurality of pixels 110.

The plurality of pixels 110 is arranged in the display region 104a of the first substrate 104. In the present embodiment, the plurality of pixels 110 is arranged in a matrix shape. The number of arrangements of the plurality of pixels 110 is arbitrary. For example, m number of pixels 110 is arranged in a row direction and n number of pixels 110 is arranged in a column direction (m and n are integers). Although not shown in FIG. 1, each of the plurality of pixels 110 is formed from a pixel circuit including at least a selection transistor, a drive transistor and a light emitting element as described herein. Furthermore, the arrangement of the plurality of pixels is not limited to a matrix shape and a delta arrangement, a pentile arrangement or other arrangement may be appropriately used.

The opposing substrate 106 includes a second substrate 108. The same substrate as the first substrate 104 may be used for the second substrate 108. The second substrate 108 is arranged facing the first substrate 104 on an upper surface of the display region 104a. The second substrate 108 is fixed to the first substrate 104 via a sealing member (not shown in the diagram) which encloses the display region 104a. The display region 104a arranged in the first substrate 104 is sealed by the second substrate 108 and the sealing member.

Furthermore, although the display device 100 related to the present embodiment includes a second substrate as described above, the second substrate is not limited to a plate shaped component but may be replaced with a film base or a sealing base coated with resin or the like.

Although not shown in the diagram, the opposing substrate 106 may further includes a color filter, a light blocking layer, a polarization plate and a phase plate and the like. A color filter is arranged at a position facing each of the plurality of pixels 110. A light blocking layer (also called a black matrix) is arranged at a position which demarcates each of the plurality of pixels 110. A polarization plate and phase plate cover the plurality of pixels 110 and are arranged on the outer side surface of the opposing substrate 106. The polarization plate and phase plate are arranged to suppress degradation in visibility due to external light incident to the display device being reflected by a pixel electrode. Furthermore, in the case where the light emitting element is separately coated in order to emit light at a fixed light emitting color independent to each of the plurality of pixels, then a color filter or light blocking layer are not absolutely necessary. In addition, in the case where a means for preventing the reflection of external light by the plurality of pixels is separately arranged, then a polarization plate or phase plate are not absolutely necessary.

The plurality of connection terminals 112 is arranged within the terminal region 104b. A plurality of terminal regions 104b is arranged on one end part of the first substrate 104 and the outer side of the second substrate 108. A wiring substrate (not shown in the diagram) which connects devices which output an image signal or a power source with the display device 100 is arranged in the plurality of connection terminals 112. A connection point between the wiring substrate and the plurality of connection terminals 112 is exposed to the exterior.

[Circuit Structure]

Figure 2:
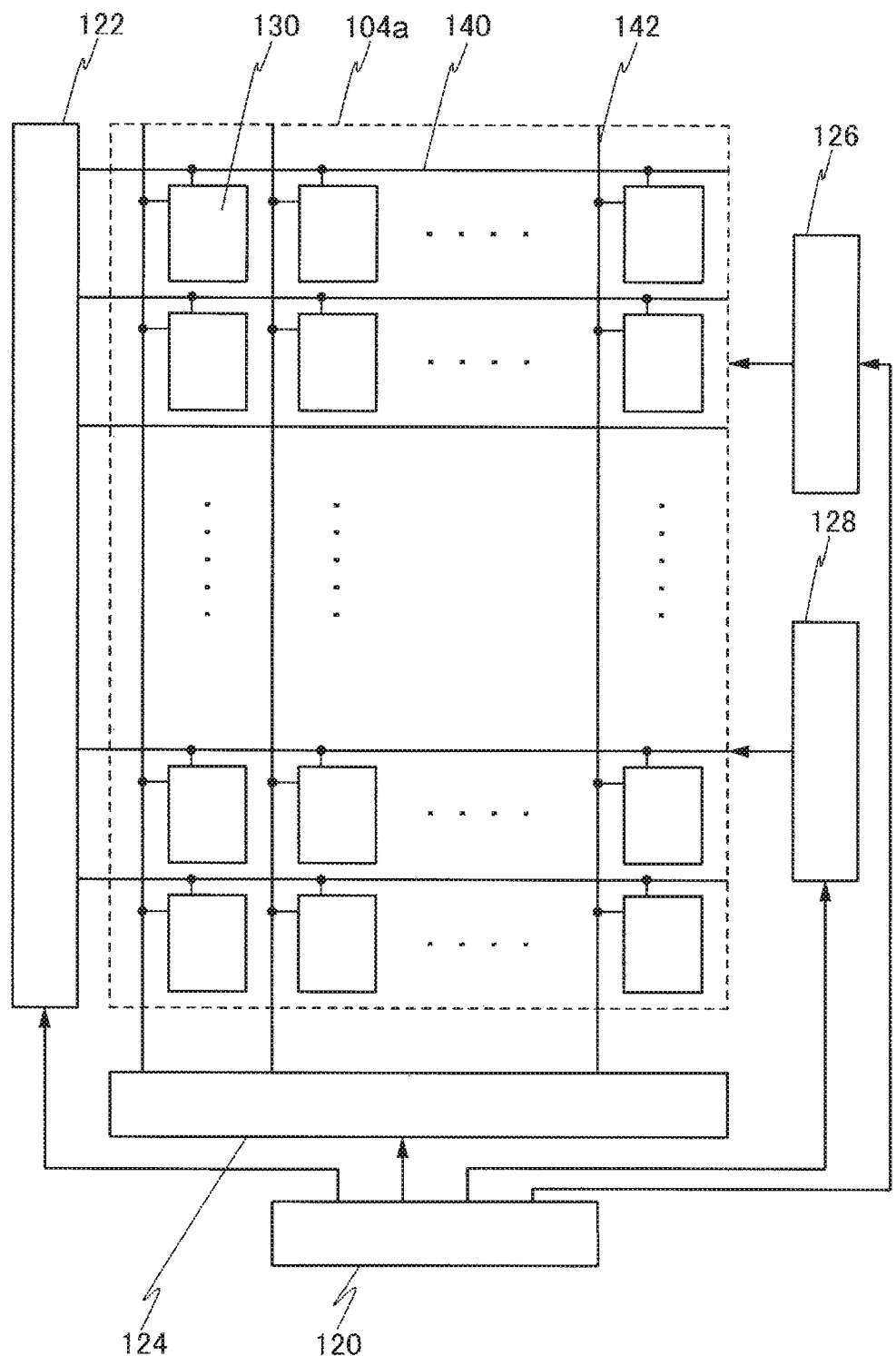
FIG. 2 is a circuit diagram for explaining a circuit structure of a display device related to one embodiment of the present invention.
Figure 3:
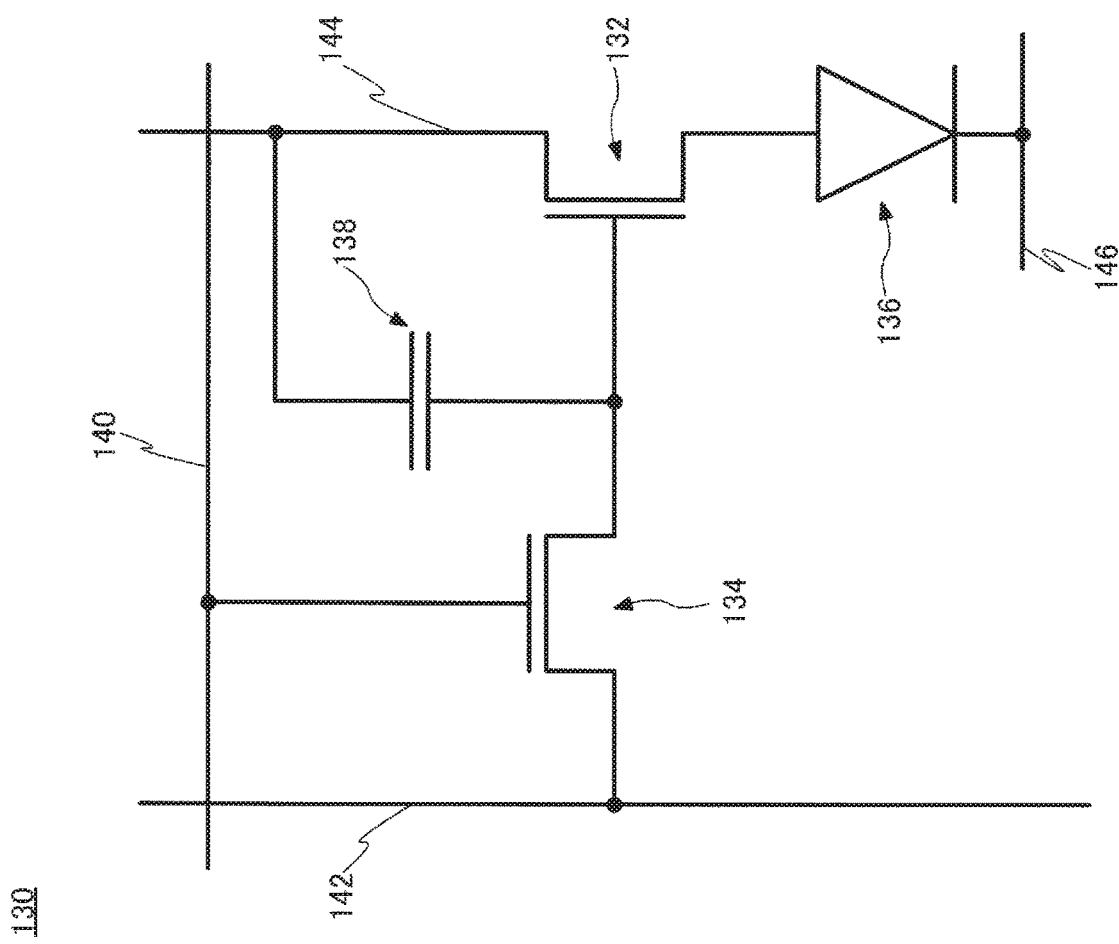
FIG. 3 is a circuit diagram for explaining a circuit structure of a pixel circuit arranged in a pixel of a display device related to one embodiment of the present invention.

FIG. 2 is a circuit diagram for explaining a circuit structure of the display device 100 related to the present embodiment. FIG. 3 is a circuit diagram for explaining a structure of a pixel circuit 130 included in each of the plurality of pixels 110 of the display device 100 related to the present embodiment.

The display device 100 related to the present embodiment is arranged with a drive part, a plurality of pixel circuits 130, a plurality of scanning signal lines 140 and a plurality of image signal lines 142.

The drive part includes a control device 120, a scanning line drive circuit 122, an image line drive circuit 124, a drive power supply circuit 126 and a reference power supply circuit 128. The drive part drives a pixel circuit 130 arranged in each of the plurality of pixels 110 and controls the light emitted by the plurality of pixels 110.

The control device 120 controls the operation of the scanning line drive circuit 122, image line drive circuit 124, drive power supply circuit 126 and reference power supply circuit 128

The scanning line drive circuit 122 is connected to the plurality of scanning signal lines 140. The plurality of scanning signal lines 140 is arranged for each pixel row in a horizontal direction of the plurality of pixels 110. The scanning line drive circuit 122 selects a plurality of scanning signal lines 140 in sequence according to a timing signal input from the control device 120.

The image line driving circuit 124 is connected to the plurality of image signal lines 142. The plurality of image signal lines 142 is arranged for each pixel column in a perpendicular direction of the plurality of pixels 110. The image line drive circuit 124 is input with an image signal from the control device 120, and together with a selection of a scanning signal line 140 by the scanning line drive circuit 122, writes a voltage according to an image signal of a selected pixel row via each of the plurality of image signal lines 142.

The drive power supply circuit 126 is connected to the drive power supply line 144 arranged in each pixel column. The drive power supply circuit 126 supplies a current for making a pixel on a selected pixel row to emit light.

The reference power supply circuit 128 is connected to a reference power supply line 146 arranged in common with each of a plurality of pixels 110. The reference power supply circuit 128 provides a constant potential to a common electrode which forms a cathode electrode of a light emitting element 136.

Next, a circuit structure of each of the plurality of pixel circuits 130 is explained. Furthermore, the circuit structure of a pixel circuit explained below is an example and is not limited to this structure.

Each of the plurality of pixel circuits 130 includes at least a first transistor 132, a second transistor 134, a light emitting element 136 and a storage capacitor 138.

The first transistor 132 functions as a drive transistor in the present embodiment. That is, the first transistor 132 is connected to a light emitting element 136 and controls the light emitting luminosity of the light emitting element 136. The gate of the first transistor 132 is connected to the second transistor 134, the source is connected to the drive power supply line 144 and the drain is connected to an anode of the light emitting element 136. A drain current of the first transistor 132 is controlled by a voltage between the gate and source. The storage capacitor 138 is connected between the gate and source of the first transistor 132 to hold a voltage between the gate and source.

The second transistor 134 functions as a selection transistor in the present embodiment. That is, the second transistor 134 controls the conduction state between an image signal line 142 and the gate of the first transistor 132 by an ON/OFF operation. The gate of the second transistor 134 is connected to the scanning signal line 140, the source is connected to the image signal line 142, and the drain is connected with the gate of the first transistor 132.

The anode of the light emitting element 136 is connected to the drain of the first transistor 132 and the cathode is connected to the reference power supply line 146.

Since the first transistor 132 functions as a drive transistor, it is driven in a saturated state. As a result, it is preferred that it is provided with a high driving capability in an ON state and it is preferred to have high carrier mobility.

Since the second transistor 134 functions as a selection transistor, it is preferred to have good switching characteristics. That is, a high current value in an ON state and a low current value in an OFF state are preferred.

In this way, the characteristics demanded for the first transistor 132 and second transistor 134 are respectively different. In an attempt to solve this, in the display device related to the present embodiment, a different semiconductor material is used in the first transistor 132 and second transistor 134. Although described in detail below, in the present embodiment the first transistor 132 is formed with a channel using poly-crystal silicon and the second transistor 134 is formed with a channel using an oxide semiconductor.

Next, the structure of each of the plurality of pixels 110 included in the display device 100 related to the present embodiment is explained in detail while referring to the diagrams.

[Pixel Structure]

Figure 4:
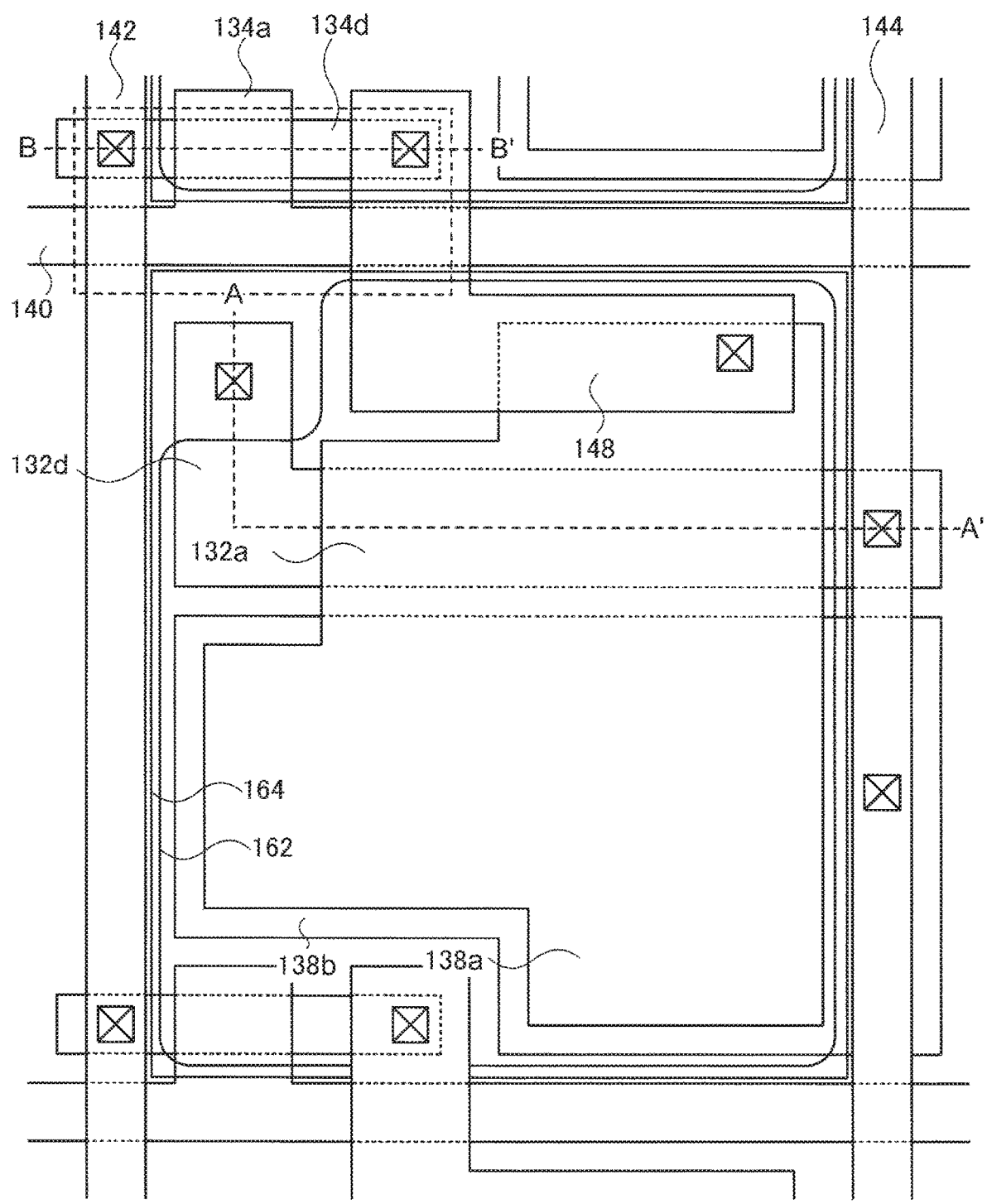
FIG. 4 is a planar view diagram for explaining a structure of a pixel of a display device related to one embodiment of the present invention.
Figure 5:
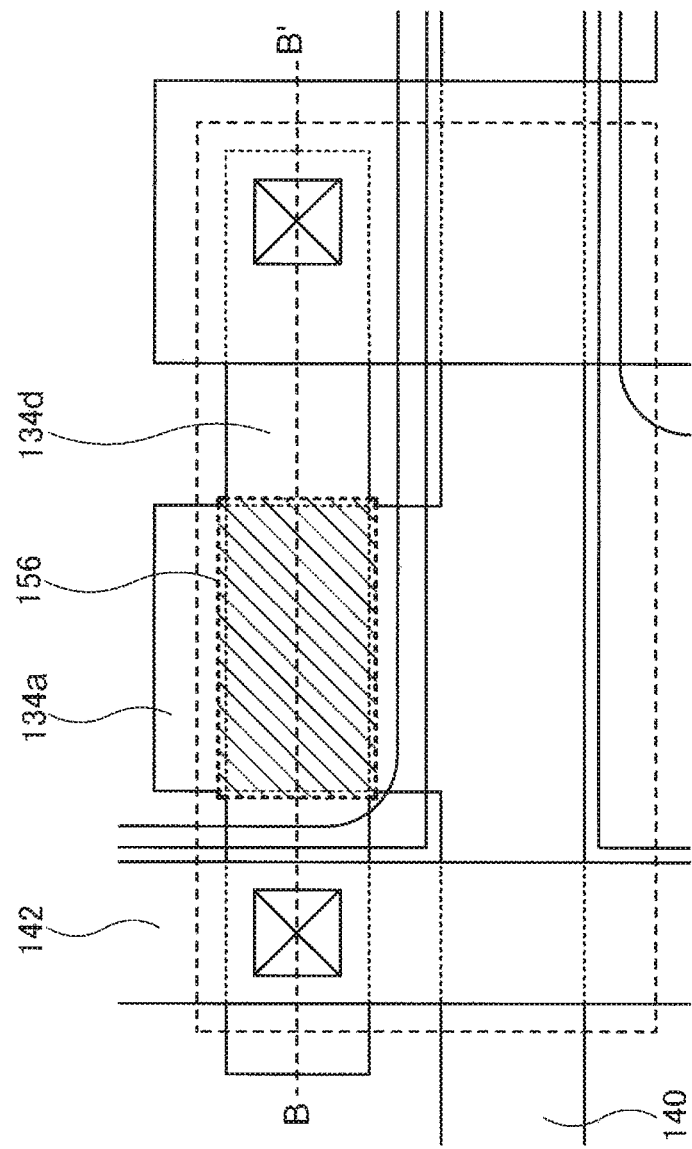
FIG. 5 is an expanded planar view diagram for explaining a structure of a pixel of a display device related to one embodiment of the present invention.
Figure 6:
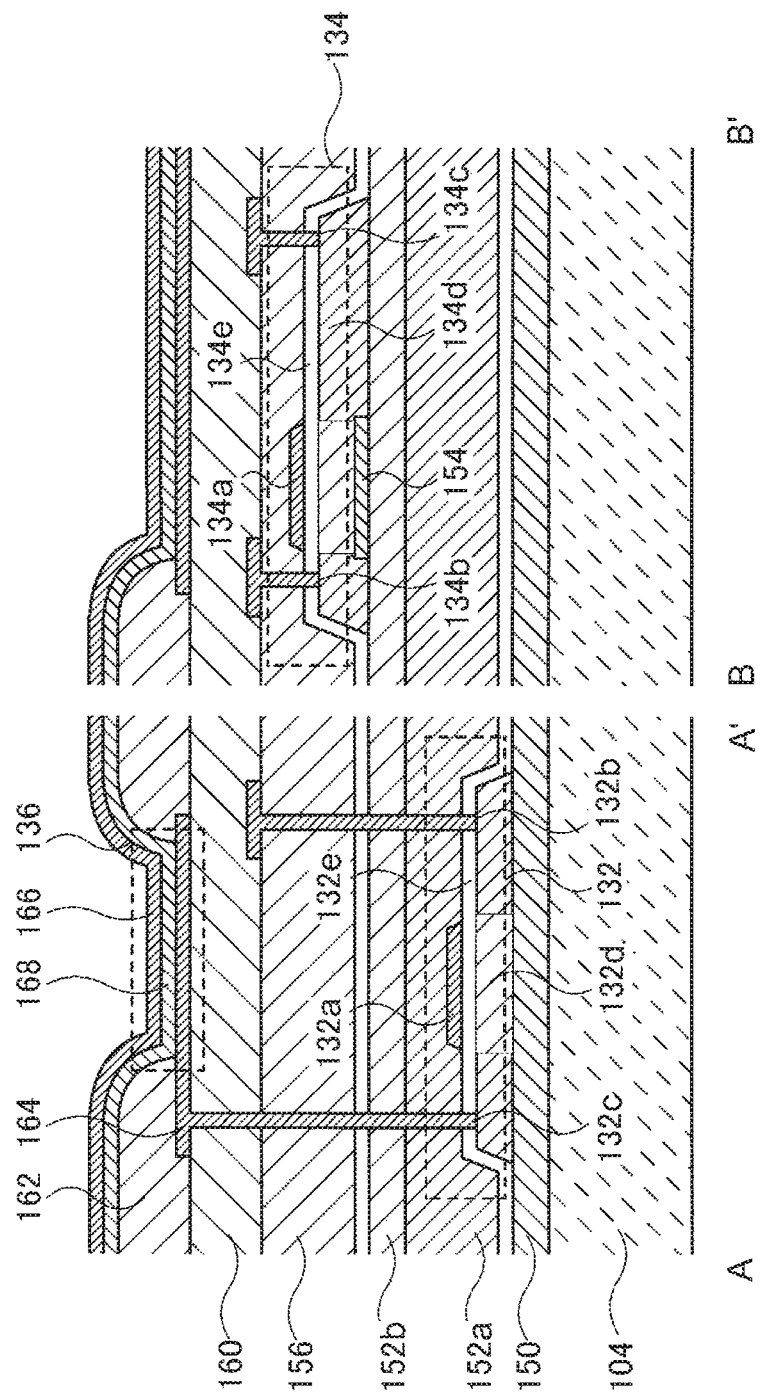
FIG. 6 is a is a cross-sectional diagram for explaining a structure of a pixel of a display device related to one embodiment of the present invention.

FIG. 4 is a planar view diagram for explaining a structure of a pixel 110 included in the display device 100 related to the present embodiment. FIG. 5 is an expanded planar view diagram for explaining a structure of a pixel 110 included in the display device 100 related to the present embodiment. FIG. 6 is a cross-sectional diagram for explaining a structure of a pixel 110 included in the display device 100 related to the present embodiment. FIG. 6 shows a cross-section between A-A' shown in FIG. 4 and between B-B' shown in FIG. 4 and FIG. 5.

As is shown in FIG. 4, the display device 100 related to the present embodiment is arranged with a first substrate 104 and a plurality of pixels 110.

It is possible to use a glass substrate, an acrylic resin substrate, an alumina substrate and polyimide substrate and the like as the material of the first substrate 104. The first substrate 104 may also be a substrate having flexibility. A resin material is used as a substrate having flexibility. It is preferred to use a high molecular material including an imide bond in repeating units as the resin material, for example, polyimide is used. Specifically, a film substrate in which polyimide is molded into a sheet shape is used as the first substrate 104.

As is shown in FIG. 6, each of the plurality of pixels 110 includes from the first substrate 104 side a barrier layer 150, a first transistor 132, a storage capacitor 138, a first insulation layer 152, a second insulation layer 154, a second transistor 134, a third insulation layer 156, a levelling insulation layer 160, a bank 162 and a light emitting element. The barrier layer 150, first insulation layer 152, second insulation layer 154, third insulation layer 156 and levelling insulation layer 160 are arranged in common to a plurality of pixels.

The barrier layer 150 is arranged on one surface of the first substrate 104. The barrier layer 150 prevents foreign objects such as impurities contained in the first substrate 104 from infiltrating to each of the plurality of pixels 110. It is possible to use an inorganic insulation material as the material of the barrier layer 150. It is possible to use a silicon oxide layer or silicon nitride layer for example as the inorganic insulation material. A stacked structure in which these layers are combined is also possible.

The first transistor 132 is arranged above the first substrate 104 interposed by the barrier layer 150. The first transistor 132 includes a first semiconductor layer 132d.

It is preferred to use a material with high carrier mobility in particular as the first semiconductor layer 132d. In the present embodiment, a poly-crystal silicon layer is used as the first semiconductor layer 132d. The first semiconductor layer 132d is sometimes explained below as poly-crystal silicon layer 132d. The poly-crystal silicon layer 132d includes a channel region and a source/drain region. The channel region is formed in a region where the poly-crystal silicon layer 132d overlaps a first gate electrode 132a. The source/drain region is arranged adjacent to the channel region and includes a higher concentration of impurities than the channel region which express that the semiconductor is a p type or n type conducting type.

P (phosphorus) is included in the source/drain region of the poly-crystal silicon layer 132d providing the poly-crystal silicon layer with an n type conductor. That is, the first transistor 132 is an n channel transistor. Furthermore, the type of conductor of the source/drain region of the first transistor 132 is not limited to an n type and may also be a p type. That is, the first transistor 132 may also be a p channel transistor.

In this way, the first transistor 132 which functions as a drive transistor includes a high drive capability in an ON state.

In the present embodiment, the first transistor 132 has what is called a top-gate structure in which a first gate electrode 132a is arranged interposed by a first gate insulation layer 132e above a poly-crystal silicon layer 132S. Furthermore, the first transistor 132 is not limited to this structure and may also have what is called a bottom-gate structure in which a first gate electrode 132a is arranged interposed by a first gate insulation layer 132e below a poly-crystal silicon layer 132d.

As is shown in FIG. 4, the first gate electrode 132a of the first transistor 132 is connected to jumper wiring 148. The jumper wiring 148 is arranged above the third insulation layer 156 and connects the first gate electrode 132a of the first transistor 132 with the drain electrode 134c of the second transistor 134. The source electrode 132b of the first transistor 132 is connected to a drive power supply line 144. The power supply line 144 is arranged above the third insulation layer. The drain electrode 132c of the first transistor 132 is connected to a pixel electrode 164. The pixel electrode 164 is arranged above the levelling insulation layer 160.

Although not shown in FIG. 6, the storage capacitor 138 is arranged in the same layer as the first transistor 132.

That is, one of the electrodes 138a of the storage capacitor 138 is arranged in the same layer as the first gate electrode 132a of the first transistor 132. That is, the one electrode 138a of the storage capacitor 138 may also be simultaneously formed with the first gate electrode 132a of the first transistor 132 using the same photolithography process. The one electrode 138a of the storage capacitor 138 and the first gate electrode 132a of the first transistor 132 are electrically connected. In the present embodiment, a single island shaped electrode pattern serves as both the one electrode 138a of the storage capacitor 138 and the first gate electrode 132a of the first transistor 132.

In addition, the other electrode 138b of the storage capacitor 138 is arranged in the same layer as the poly-crystal silicon layer 132d of the first transistor 132. That is, the other electrode 138b of the storage capacitor 138 may also be simultaneously formed with the poly-crystal silicon layer 132d of the first transistor 132 using the same photolithography process. Furthermore, in the present embodiment, although the other electrode 138b of the storage capacitor 138 and the poly-crystal silicon layer 132d of the first transistor 132 are arranged apart from each other, they may also be arranged connected to each other.

In a layer structure, the first insulation layer 152 is arranged in a layer between the first semiconductor layer 132d and second semiconductor layer 134d. In addition, in a planar structure, the first insulation layer 152 is arranged across the display region 104a.

In the present embodiment, the first insulation layer 152 includes a silicon nitride layer 152a and a silicon oxide layer 152b from the bottom layer.

The silicon nitride layer 152a includes a relatively high concentration of hydrogen and is a layer which easily discharges hydrogen. In this way, it is possible to supply hydrogen to the poly-crystal silicon layer 132d of the first transistor 132. When hydrogen is supplied to the poly-crystal silicon layer 132d, dangling bonds which exist at the interface and interior of the poly-crystal silicon are terminated by hydrogen atoms and thereby the energy level density within an energy gap decreases and the characteristics of the first transistor 132 improve.

The silicon oxide layer 152b is arranged to disperse the hydrogen contained in the silicon nitride layer 152a arranged thereunder to the exterior and significantly prevents the infiltration of hydrogen to the second semiconductor layer 134d arranged thereupon.

The second transistor 134 is arranged above the first insulation layer 152. The second transistor 134 includes a second semiconductor layer 134d. The second semiconductor layer 134d is arranged on a layer further above the poly-crystal silicon layer 132d.

It is preferred to use a material for the second semiconductor layer 134d that can significantly suppress a leak current in an OFF state of the second transistor 134. In the present embodiment, an oxide semiconductor layer is used as the second semiconductor layer 134d. The second semiconductor layer 134d is sometimes referred to as oxide semiconductor layer 134d below. A region of the second transistor 134 becomes a channel region where the oxide semiconductor layer 134d and second gate electrode 134a overlap. In the present embodiment, the second transistor 134 is an n channel type transistor.

In this way, the second transistor 134 which functions as a selection transistor can reduce a leak current in an OFF state. In this way, referring to the pixel circuit 130 shown in FIG. 3, it is possible to suppress a loss in charge of the storage capacitor 138 due to a leak current between a source and drain even when the second transistor 134 is in an OFF state.

In the present embodiment, the second transistor 134 has what is called a top-gate structure in which a second gate electrode 134a is arranged interposed by a second gate insulation layer 134e above an oxide semiconductor layer 134d. Furthermore, the second transistor 134 is not limited to this structure and may also have what is called a bottom-gate structure in which a second gate electrode 134a is arranged interposed by a second gate insulation layer 134e below an oxide semiconductor layer 134d.

The first gate electrode 132a of the first transistor 132 extends from a scanning signal line 140. The scanning signal line 140 is arranged above the first insulation layer 132e of the first transistor 132. That is, the scanning signal line 140 also serves as the first gate electrode 132a of the first transistor 132. The source electrode 132b of the first transistor 132 is connected to an image signal line 142. The image signal line 142 is arranged above the second insulation layer 154. The drain electrode 132c of the first transistor 132 is connected to the jumper wiring 148. The jumper wiring 148 is arranged above the third insulation layer and is arranged to connect the first gate electrode 132a of the first transistor 132 with the drain electrode 134c of the second transistor 134.

In a layer structure, the second insulation layer 154 is arranged between the second transistor 134 and first insulation layer 152. In the present embodiment, the second insulation layer 154 is arranged in contact with the oxide semiconductor layer 134d. In addition, in a planar structure, the second insulation layer 154 is arranged across a channel region of at least the oxide semiconductor layer 134d. That is, in a planar structure, the second insulation layer 154 is arranged in a region where an island shape oxide semiconductor layer 134d and second gate electrode 134a overlap. In this way, a channel region of the oxide semiconductor layer 134d and the silicon oxide layer 152b are separated.

It is preferred to use a material which contains a low amount of hydrogen and significantly allows hydrogen to pass through as the material of the second insulation layer 154. In the present embodiment, the second insulation layer 154 is a metal oxide with insulation properties, an aluminum oxide for example, and specifically it is preferred to include an aluminum (also called alumina) oxide layer.

By adopting such a structure, the second insulation layer 154 blocks an infiltration path of hydrogen to the interior of the oxide semiconductor layer 134d from the exterior of the oxide semiconductor layer 134d. In particular, it is possible to effectively block hydrogen which is discharged from the silicon nitride layer 152a which hydrogenates the poly-crystal silicon layer 132d of the first transistor 132 from infiltrating to the oxide semiconductor layer 134d via the silicon oxide layer 152b. Furthermore, it is possible to effectively block hydrogen contained in the silicon oxide layer 152b and discharged from the silicon oxide layer 152b from infiltrating to the oxide semiconductor layer 134d.

When hydrogen infiltrates the oxide semiconductor layer 134d, threshold variation of the second transistor 134 increases, channel mobility decreases and there is concern that transistor characteristics will degrade.

Furthermore, by adopting such a structure, it is possible to supply oxygen to the oxide semiconductor layer 134d from the second insulation layer 154. In this way, threshold variation of the second transistor 134 is reduced.

In the present embodiment, the second insulation layer 154 is arranged corresponding to a channel region of the oxide semiconductor layer 134d and is arranged in contact with the oxide semiconductor layer 134d. However, the layout of the second insulation layer 154 is not limited thereto and the second insulation layer 154 may also overlap with at least a channel region in a planar view.

That is, the second insulation layer 154 may also be arranged from an interior of a channel region across a region extending to an exterior part thereof. As an example, the second insulation layer 154 may be arranged across a region extending up to a certain distance from a periphery part of a channel region. In other words, the second insulation layer 154 may be arranged at a size where an exterior periphery end part is located on the outer side with respect to a region where the oxide semiconductor layer 134d and second gate electrode 134a overlap. In this way, it is possible to block hydrogen which is dispersed from the silicon nitride layer 152a arranged on a lower layer side of the second insulation layer 154 and ensure that the oxide semiconductor layer 134d is not affected. As another example, the second insulation layer 154 may also be arranged across a region of one pixel.

Furthermore, a periphery part of the second insulation layer 154 may have a taper shape.

The third insulation layer 156 is arranged above the second transistor 134. It is possible to use an inorganic insulation material as the material of the third insulation layer. For example, it is possible to use a silicon oxide layer or silicon nitride layer and the like as the inorganic insulation material. Furthermore, in this case, it is preferred that the material is manufactured under the condition that the silicon oxide layer or silicon nitride layer does not include a significant amount of hydrogen.

The levelling insulation layer 160 is arranged above the third insulation layer 156. The levelling insulation layer 160 is arranged to level concave and convex parts caused by each type of transistor or wiring and the like arranged on a layer thereunder. It is possible to use an organic insulation material as the material of the levelling insulation layer 160. It is possible to use acrylic resin or polyimide resin and the like as the organic insulation material.

The light emitting element is arranged above the levelling insulation layer 160. The light emitting element is a self-light emitting type light emitting element. For example, it is possible to use an organic EL light emitting element as the self-light emitting type light emitting element. The organic EL light emitting element includes a pixel electrode 164, a common electrode 166 and light emitting layer 168.

A pixel electrode 164 is arranged corresponding to each of a plurality of pixels 110. It is preferred to include a metal layer with high reflectance as the material of the pixel electrode 164 in order to reflect light emitted by the light emitting layer 168 to the common pixel electrode 166 side. For example, it is possible to use silver (Ag) as the metal layer with high reflectance.

Furthermore, in addition to a metal layer with high reflectance mentioned above, a transparent conductive layer may also be stacked. For example, it is preferred to use ITO (indium oxide added with tin) or IZO (indium zinc oxide) as the transparent conductive layer. In addition, an arbitrary combination of these may also be used.

A common electrode 166 is arranged across a plurality of pixels 110. It is preferred to use a material having translucency and conductivity as the material of the common electrode 166 in order to allow light emitted by a light emitting layer 168 to pass through. For example, it is preferred to use ITO (indium oxide added with tin) or IZO (indium zinc oxide) as the material of the common electrode 166. Alternatively, a metal layer having a film thickness sufficient to allow emitted light to pass through may also be used as the common electrode 166.

The light emitting layer 168 is arranged supported by the pixel electrode 164 and common electrode 166. The material of the light emitting layer 168 is an organic EL material which emits light when supplied with a current. It is possible to use a low molecular or high molecular material as the organic EL material. In the case where a low molecular organic material is used, in addition to an organic material having light emitting properties, the light emitting layer 168 is formed including a hole injection layer or electron injection layer or a hole transport layer or electron transport layer in order to hold an organic material having light emitting properties.

A bank 162 is arranged between two adjacent pixels 110. The bank 162 is arranged to cover a periphery edge part of a pixel electrode 164. Furthermore, the bank 162 is arranged to cover a connection part between the drain electrode 132c of the first transistor 132 and the pixel electrode 164.

It is preferred to use an insulation material as the material of the bank 162. It is possible to use an inorganic insulation material or an organic insulation material as the insulation material. It is possible to use silicon oxide, silicon nitride or a combination thereof for example as an inorganic insulation material. It is possible to use a polyimide resin, an acrylic resin or a combination thereof for example as an organic insulation material. An inorganic insulation material and organic insulation material may also be used in combination.

By arranging the bank 162 formed from an insulation material, it is possible to prevent a common electrode 166 and pixel electrode 164 from short circuiting at an end part of the pixel electrode 164. Furthermore, it is possible to securely insulate adjacent pixels 110.

By adopting the structure of display device 100 related to the present embodiment, it is possible to effectively block an infiltration path of hydrogen from the exterior of the oxide semiconductor layer 134d to the interior of the oxide semiconductor layer 134d. Furthermore, by adopting such a structure, it is possible to supply oxygen to the oxide semiconductor layer 134d from the second insulation layer 154. In this way, it is possible to prevent a reduction in channel mobility of the second transistor 134 and suppress a threshold variation, and also prevent degradation in characteristics of the second transistor. In this way, it is possible to improve reliability and provide the display device 100 with a long lifetime.

Furthermore, in the present embodiment, a form is shown in which the first transistor 132 having the poly-crystal silicon layer 132S is set as a drive transistor, and the second transistor 134 having the oxide semiconductor layer 134d is set as a selection transistor. However, the present invention is not limited to this form, and apart from maintaining the stacked structure of the display device 100, it is possible to set the first transistor 132 having the poly-crystal silicon layer 132S as a selection transistor, and the second transistor 134 having the oxide semiconductor layer 134d as a drive transistor.

The different points from the display device 100 related to the present embodiment in this case are as follows. In a planar structure, only the layout of the oxide semiconductor layer 134d and poly-crystal silicon layer 132S shown in FIG. 4 is switched. In a cross-sectional structure, since the arrangement of the first transistor 132 and second transistor 134 is switched, the depth of a contact hole for connecting each wiring and each electrode changes. In addition, a scanning signal line 140 serves as the first gate electrode 132a of the first transistor 132. Therefore, the arrangement of a scanning signal line 140 in a layer structure changes.

Second Embodiment

The structure of a display device 200 related to the present embodiment is explained while referring to the diagrams. Furthermore, an explanation with respect to common patent specific matters between the display device 100 related to the first embodiment and the display device 200 related to the present embodiment may be omitted and an explanation centering on the different points is provided.

Figure 7:
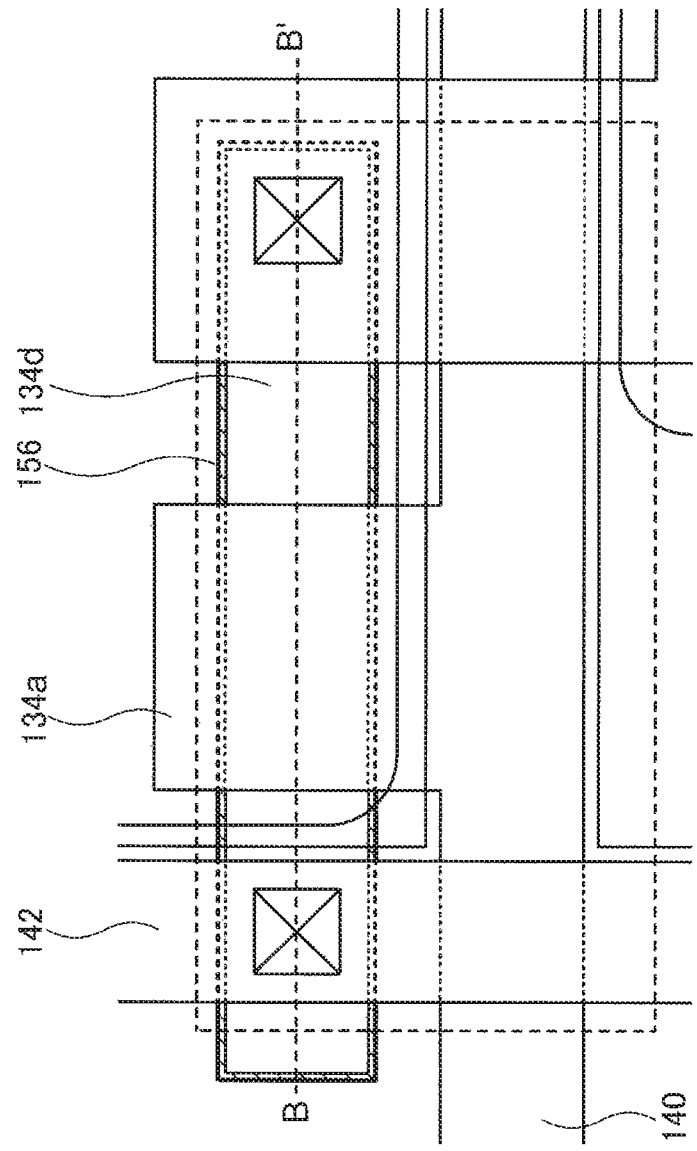
FIG. 7 is an expanded planar view diagram for explaining a structure of a pixel of a display device related to one embodiment of the present invention.
Figure 8:
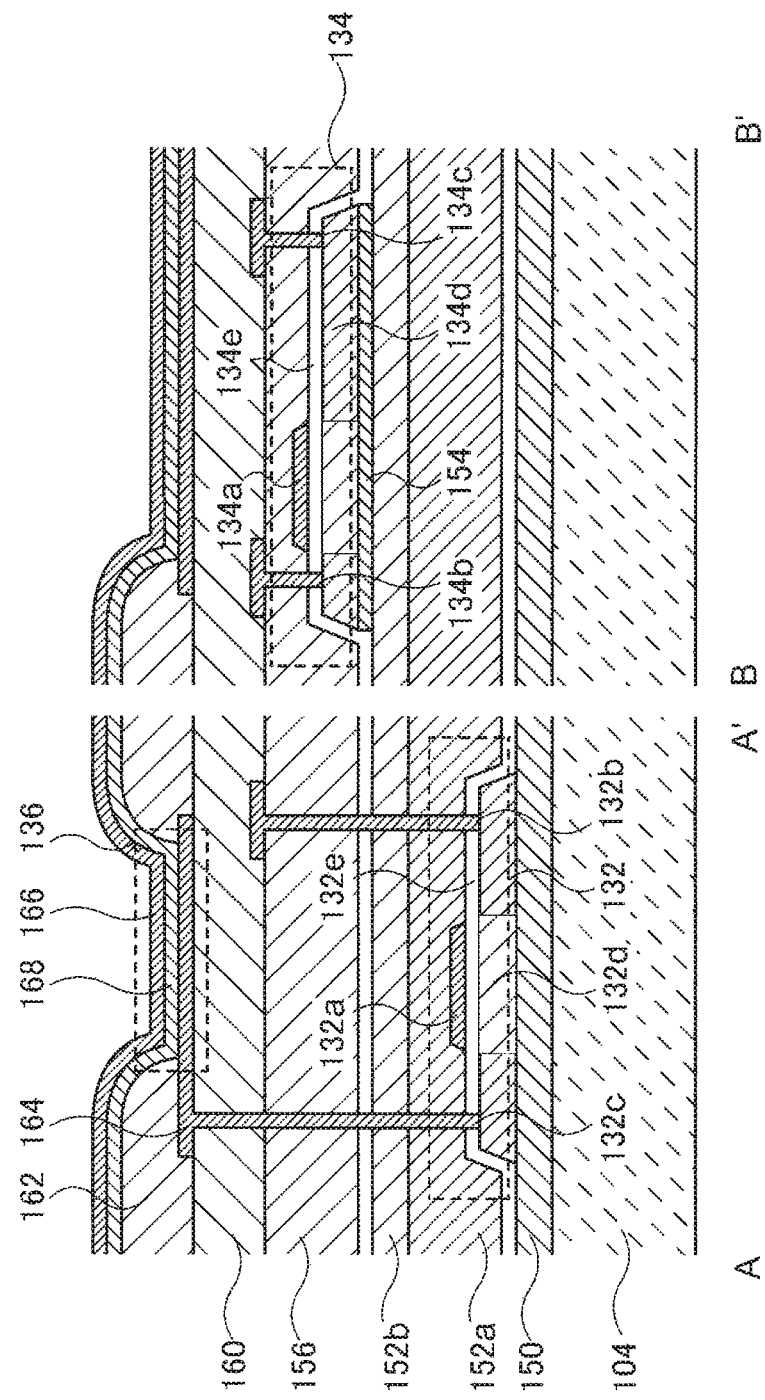
FIG. 8 is a cross-sectional diagram for explaining a structure of a pixel of a display device related to one embodiment of the present invention.

FIG. 7 is an expanded planar view diagram for explaining the structure of a pixel 110 included in the display device 200 related to the present embodiment. FIG. 8 is a cross-sectional diagram for explaining a structure of a pixel 110 included in the display device 200 related to the present embodiment. FIG. 8 shows a cross-section between A-A' shown in FIG. 4 and B-B' shown in FIG. 4 and FIG. 7.

When the display device 100 related to the first embodiment and the display device 200 related to the present embodiment are compared, the display device 200 related to the present embodiment is different in that in the structure of each of a plurality of pixels 110, a second insulation layer 154 is arranged across the entire region of an oxide semiconductor layer 134d.

By adopting such a structure, it is possible to effectively block an infiltration path of hydrogen from the exterior of the oxide semiconductor layer 134d to the interior of the oxide semiconductor layer 134d. Furthermore, by adopting such a structure, it is possible to supply oxygen to the oxide semiconductor layer 134d from the second insulation layer 154. In this way, it is possible to prevent a reduction in channel mobility of the second transistor 134 and suppress a threshold variation, and also prevent degradation in characteristics of the second transistor 134. In this way, it is possible to improve reliability and provide the display device 200 with a long lifetime.

In the present embodiment, the second insulation layer 154 is arranged in a region of an island shaped oxide semiconductor layer 134d. However, the layout of the second insulation layer 154 is not limited thereto and the second insulation layer 154 may overlap at least a region of the island shaped oxide semiconductor layer 134d in a planar view.

That is, the second insulation layer 154 may be arranged across a region extending from within a region of the island shaped oxide semiconductor layer 134d to an exterior part thereof. As an example, the second insulation layer 154 may be arranged in a region which extends to a certain distance from a periphery part of a region of the island shaped oxide semiconductor layer 134d. As another example, as is shown in FIG. 9, the second insulation layer 154 may be arranged across a region of one pixel.

Third Embodiment

The structure of a display device 300 related to the present embodiment is explained while referring to the diagrams. Furthermore, an explanation with respect to common patent specific matters between the display device 100 related to the first embodiment and the display device 300 related to the present embodiment may be omitted and an explanation centering on the different points is provided.

Figure 9:
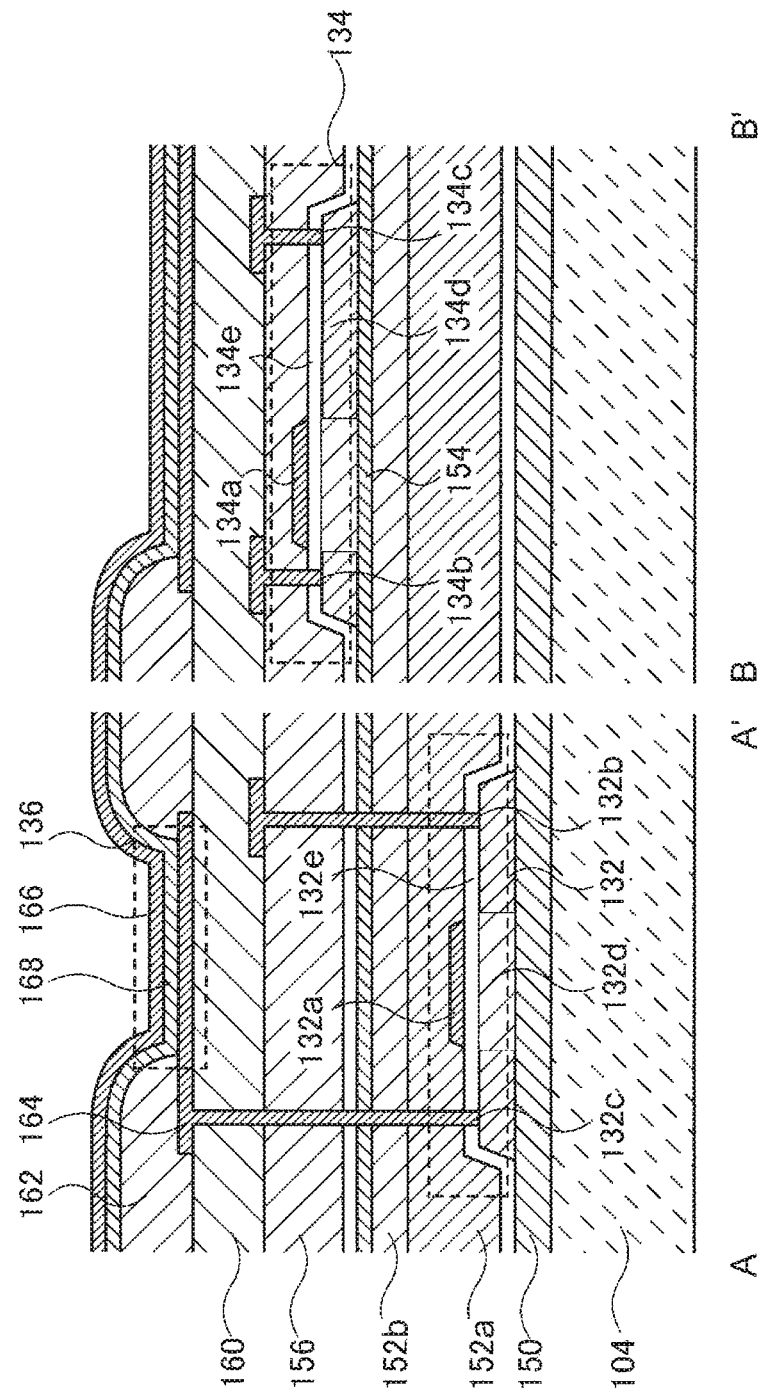
FIG. 9 is a cross-sectional diagram for explaining a structure of a pixel of a display device related to one embodiment of the present invention.

FIG. 9 is a cross-sectional diagram for explaining the structure of a pixel 110 included in the display device 300 related to the present embodiment. FIG. 9 shows a cross-section between A-A' shown in FIG. 4 and B-B' shown in FIG. 4.

When the display device 100 related to the first embodiment and the display device 300 related to the present embodiment are compared, the display device 300 related to the present embodiment is different in that in the structure of each of a plurality of pixels 110, a second insulation layer 154 is arranged across the entire region of a plurality of pixels 110.

By adopting such a structure, it is possible to effectively block an infiltration path of hydrogen from the exterior of the oxide semiconductor layer 134d to the interior of the oxide semiconductor layer 134d. Furthermore, by adopting such a structure, it is possible to supply oxygen to the oxide semiconductor layer 134d from the second insulation layer 154. In this way, it is possible to prevent a reduction in channel mobility of the second transistor 134 and suppress a threshold variation, and also prevent degradation in characteristics of the second transistor 134. In this way, it is possible to improve reliability and provide the display device 300 with a long lifetime.

Furthermore, if the second insulation layer 154 is arranged across the display region 104a as in the present embodiment, it is possible to omit a patterning process and simplify the manufacturing process. Furthermore, since the second insulation layer 154 functions as an interlayer insulation layer, it is possible to make the silicon oxide layer 152b thinner. In this way, a reduction in material costs, a shortening of tact time and easier formation of a contact hole can be expected.

Fourth Embodiment

The structure of a display device 400 related to the present embodiment is explained while referring to the diagrams. Furthermore, an explanation with respect to common patent specific matters between the display device 100 related to the first embodiment and the display device 400 related to the present embodiment may be omitted and an explanation centering on the different points is provided.

Figure 10:
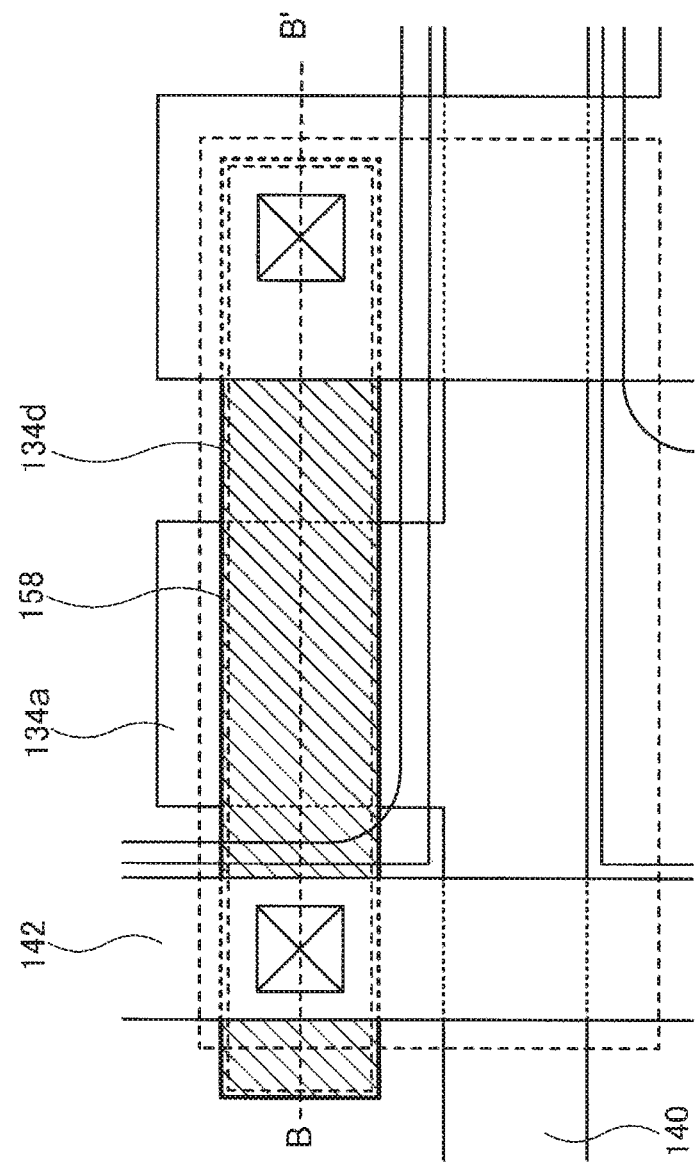
FIG. 10 is an expanded planar view diagram for explaining a structure of a pixel of a display device related to one embodiment of the present invention.
Figure 11:
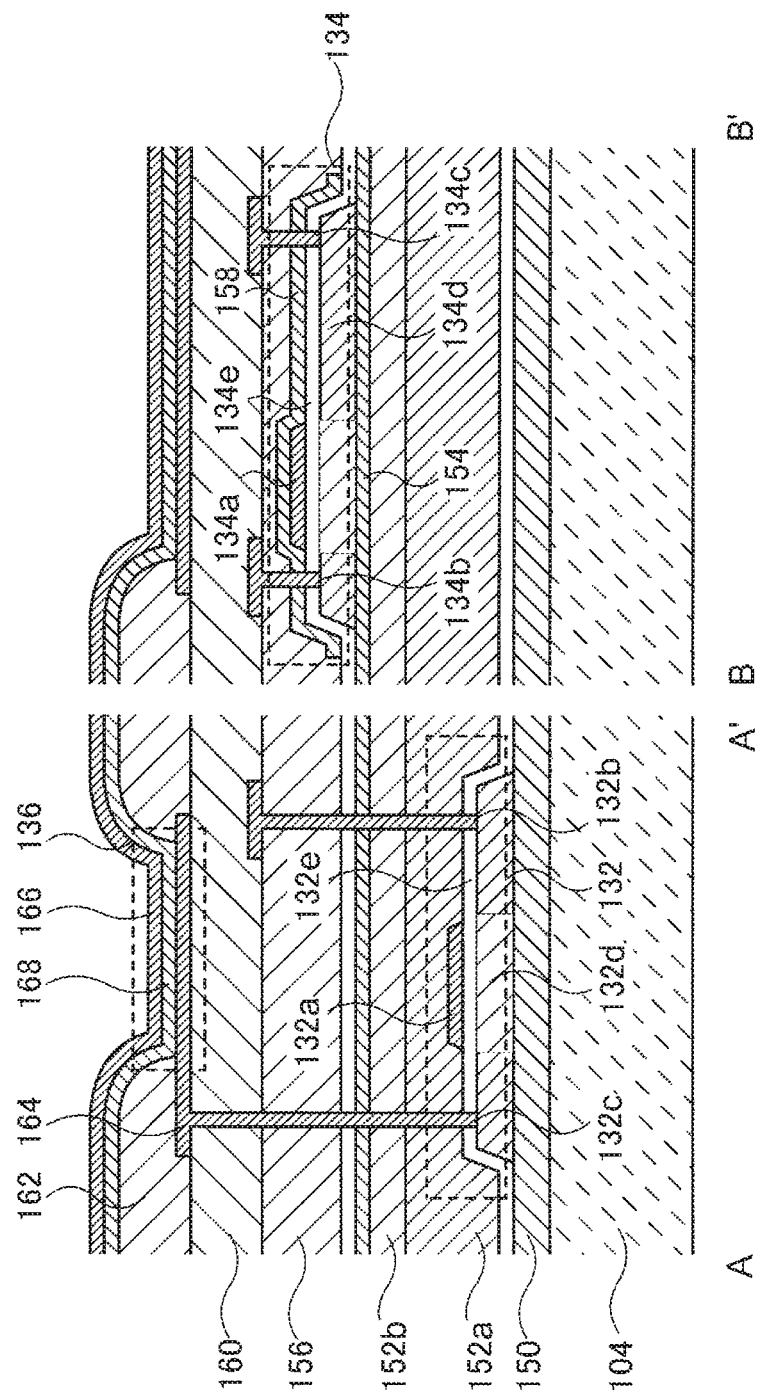
FIG. 11 is a cross-sectional diagram for explaining a structure of a pixel of a display device related to one embodiment of the present invention.

FIG. 10 is an expanded planar view diagram for explaining the structure of a pixel 110 included in the display device 400 related to the present embodiment. FIG. 11 is a cross-sectional diagram for explaining a structure of a pixel 110 included in the display device 400 related to the present embodiment. FIG. 11 shows a cross-section between A-A' shown in FIG. 4 and FIG. 10 and B-B' shown in FIG. 4.

When the display device 100 related to the first embodiment and the display device 400 related to the present embodiment are compared, each of a plurality of pixels 110 in the display device 400 related to the present embodiment is further arranged with a fourth insulation layer 158. The fourth insulation layer 158 includes an aluminum oxide layer and is arranged above the second transistor 134.

By adopting such a structure, it is possible to effectively block an infiltration path of hydrogen from the exterior of the oxide semiconductor layer 134d to the interior of the oxide semiconductor layer 134d. Here, it is possible to effectively block an infiltration path of hydrogen from below and above the second transistor 134. Furthermore, by adopting such a structure, it is possible to supply oxygen to the oxide semiconductor layer 134d from the second insulation layer 154. In this way, it is possible to prevent a reduction in channel mobility of the second transistor 134 and suppress a threshold variation, and also prevent degradation in characteristics of the second transistor 134. In this way, it is possible to improve reliability and provide the display device 400 with a long lifetime.

Fifth Embodiment

The structure of a display device 500 related to the present embodiment is explained while referring to the diagrams. Furthermore, an explanation with respect to common patent specific matters between the display device 100 related to the first embodiment and the display device 500 related to the present embodiment may be omitted and an explanation centering on the different points is provided.

Figure 12:
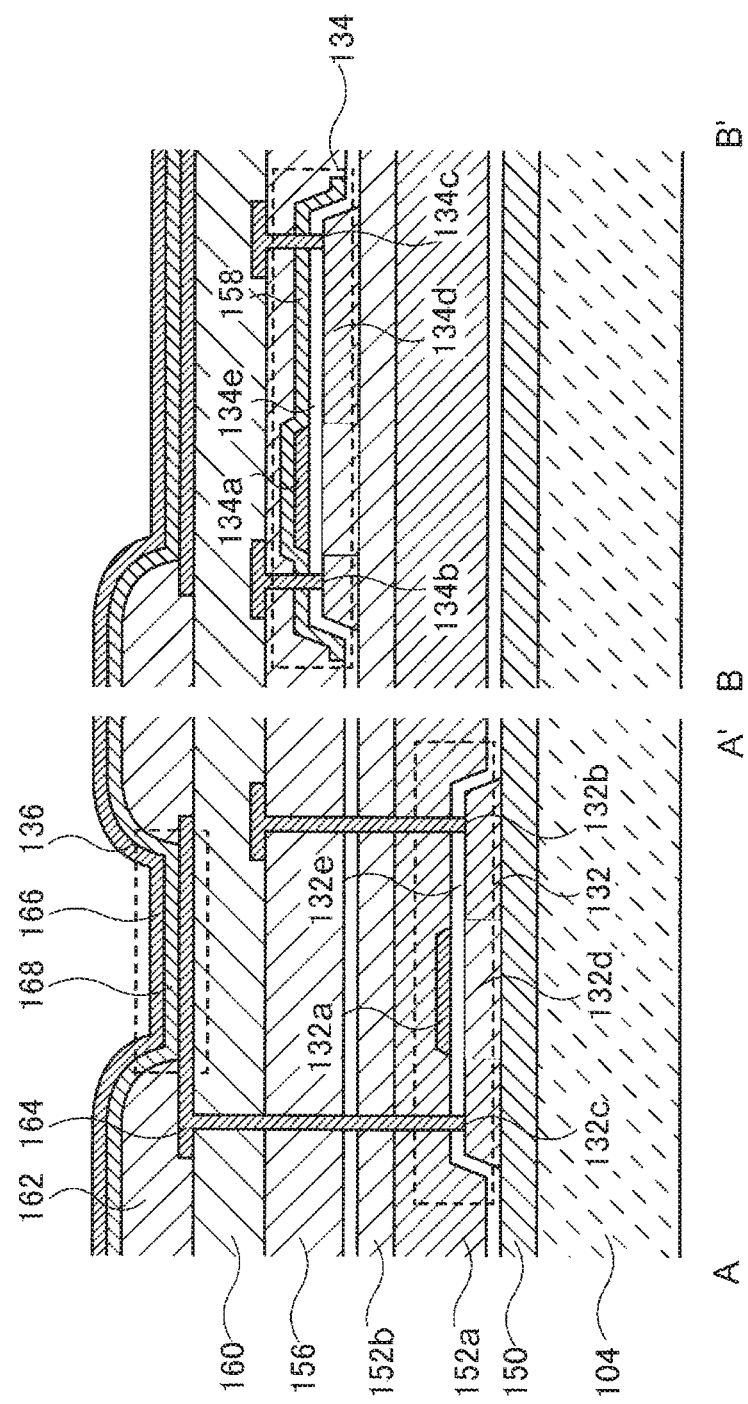
FIG. 12 is a cross-sectional diagram for explaining a structure of a pixel of a display device related to one embodiment of the present invention.

Since the expanded planar view diagram in FIG. 10 and the display device 500 related to the present embodiment are common, this diagram is also used in an explanation of the display device 500 related to the present embodiment. FIG. 12 is a cross-sectional diagram for explaining a structure of a pixel 110 included in the display device 500 related to the present embodiment. FIG. 12 shows a cross-section between A-A' shown in FIG. 4 and FIG. 10 and B-B' shown in FIG. 4.

When the display device 100 related to the first embodiment and the display device 500 related to the present embodiment are compared, each of a plurality of pixels 110 in the display device 500 related to the present embodiment is arranged with a fourth insulation layer 158. The fourth insulation layer 158 includes an aluminum oxide layer and is arranged above the second transistor 134. On the other hand, when the display device 400 related to the fourth embodiment and the display device 500 related to the present embodiment are compared, the second insulation layer 154 arranged between the second transistor 134 and the first insulation layer 152 is omitted.

By adopting such a structure, it is possible to effectively block an infiltration path of hydrogen from the exterior of the oxide semiconductor layer 134d to the interior of the oxide semiconductor layer 134d. Here, it is possible to effectively block an infiltration path of hydrogen from above the second transistor 134. Furthermore, by adopting such a structure, it is possible to simplify processes compared with the fourth embodiment and supply oxygen to the oxide semiconductor layer 134d from the third insulation layer 156. In this way, it is possible to prevent a reduction in channel mobility of the second transistor 134 and suppress a threshold variation, and also prevent degradation in characteristics of the second transistor 134. In this way, it is possible to improve reliability and provide the display device 500 with a long lifetime.

Although a number of embodiments of the present invention were explained above, the present invention is not limited to these embodiments and various modifications may be made without departing from the concept of the present invention and such modifications should be contained within the scope of the present invention.

What is claimed is:

1. A TFT array substrate comprising:
a substrate; and
a plurality of pixels arranged in the substrate;
wherein
each of the plurality of pixels includes a light emitting element, a first transistor, a second transistor, a first insulation layer, a third insulation layer, and a fourth insulation layer;
the first transistor includes a first semiconductor layer,
the second transistor includes a second semiconductor layer, a gate insulation layer, and a gate electrode,
the first insulation layer is arranged across the plurality of pixels between the first semiconductor layer and the second semiconductor layer,
the second semiconductor layer is in contact with the first insulation layer,
the gate insulation layer is stacked to cover the second semiconductor layer,
the gate electrode is arranged over the gate insulation layer,
the fourth insulation layer is stacked to cover the gate electrode and the second semiconductor layer,
the third insulation layer is stacked to cover the fourth insulation layer,
the first semiconductor layer is arranged on the substrate side sandwiching the first insulation layer with respect to the second semiconductor layer,
wherein the first insulation layer includes a silicon oxide layer and the fourth insulation layer includes an aluminum oxide layer, and
the aluminum oxide layer overlaps with the second semiconductor layer and does not overlap with the first semiconductor layer in a plan view.

2. The TFT array substrate according to claim 1, wherein the first semiconductor layer is a polycrystal silicon layer and the second semiconductor layer is a semiconductor oxide layer.

3. The TFT array substrate according to claim 1, wherein the first transistor is a drive transistor and the second transistor is a selection transistor.

4. The TFT array substrate according to claim 1, wherein the second transistor has a top-gate structure.

* * * * *